(12) United States Patent
Su (10) Patent No.: US 6,770,510 B1
(45) Date of Patent: Aug. 3, 2004

(54) FLIP CHIP PROCESS OF FLUX-LESS NO-FLOW UNDERFILL

(75) Inventor: Chao-Yuan Su, Koahsiung (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/236,336

(22) Filed: Sep. 6, 2002

(51) Int. Cl.[7] .......................... H01L 21/48; B23K 31/02
(52) U.S. Cl. .................. 438/108; 438/613; 228/180.22
(58) Field of Search .................. 438/106, 108, 438/118, 119, 612, 613, 689, 706–710; 228/180.21, 180.22; 257/737, 738, 778, 779, 780

(56) References Cited

U.S. PATENT DOCUMENTS

| | | | |
|---|---|---|---|
| 5,776,551 A | * 7/1998 | Pasch | 427/534 |
| 5,869,899 A | * 2/1999 | Arledge et al. | 257/738 |
| 5,891,795 A | * 4/1999 | Arledge et al. | 438/613 |
| 5,899,737 A | * 5/1999 | Trabucco | 438/615 |
| 6,051,489 A | 4/2000 | Young et al. | 438/612 |
| 6,168,972 B1 | 1/2001 | Wang et al. | 438/108 |
| 6,186,392 B1 | * 2/2001 | Ball | 228/245 |
| 6,268,114 B1 | 7/2001 | Wen et al. | 430/314 |
| 6,283,358 B1 | * 9/2001 | Ball | 228/180.21 |
| 6,284,086 B1 | 9/2001 | Cardellino et al. | 156/273.7 |
| 6,365,435 B1 | * 4/2002 | Wang et al. | 438/108 |
| 6,489,180 B1 | * 12/2002 | Tsai et al. | 438/108 |
| 6,555,908 B1 | * 4/2003 | Eichelberger et al. | 257/737 |

* cited by examiner

Primary Examiner—Alonzo Chambliss
(74) Attorney, Agent, or Firm—George O. Saile; Stephen B. Ackerman (57) ABSTRACT

A new method is provided to remove the conventional accumulation of a layer of tin oxide over the surface of solder bumps by means of fluorine based plasma treatment of the solder bumps. In addition, an improved method is provided for the application of underfill that replaces the conventional method of providing an underfill for a packaged flip chip device.

29 Claims, 6 Drawing Sheets

FLIP CHIP PROCESS OF FLUX-LESS NO-FLOW UNDERFILL

BACKGROUND OF THE INVENTION (1) Field of the Invention

The invention relates to the fabrication of integrated circuit devices, and more particularly, to aspects of providing an underfill and of applying solder flux in creating flip-chip semiconductor device packages.

(2) Description of the Prior Art

Flip chip technology is a technique whereby interconnections are made between a first array of contact points provided over an active surface of a semiconductor chip and a second array of contact points provided over the surface of a flip chip supporting substrate. Typically, solder bumps are provided as terminals over the active surface of the flip chip, these solder bumps are aligned and bonded with contact pads provided over the surface of a substrate that serves as a semiconductor device mounting support.

Flip chip bonding provides advantages of a reduction in the interconnection length, a smaller package footprint and allows for a lower package profile when compared with conventional wire bond packages. Most significantly however is the advantage that is offered by the flip chip technology of significantly extending input/output capabilities of the mounted chip since the flip chip technology is not limited to providing points of I/O interconnect of the mounted chip in accordance with a particular pattern or array but can provide points of I/O interconnect across the entire active surface of the mounted device. The limitation that is in this case still in place is a limitation of the pitch or spacing by which the points of electrical contact can be created over the interfacing surfaces.

One of the methods that has been employed for mounting semiconductor devices over a supporting substrate comprises the use of Ball Grid Array (BGA) contact points, whereby a pattern of closely spaced contact balls or solder bumps over the active surface of the chip is used to provide interconnection between the flip chip and a supporting, frequently ceramic based, substrate. This approach, although allowing for extended I/O capabilities, presents problems of contact ball and solder joint reliability. This latter problem is greatly exacerbated by impact of thermal cycling during the creation of the semiconductor device package and by excessive mechanical stress that is exerted on one or more of the applied contact balls due to lack of planarity of the interfacing points of contact.

The art has long used the method of providing underfill to offset negative effects of lifetime fatigue that is typically experienced by solder connections in a flip chip interconnect arrangement. This approach applies an epoxy-based underfill in the voids between the active surface of the flip chip and the surface of the supporting substrate over which the flip chip is mounted. The underfill completely surrounds the aligned and joined points of interfacing electrical contacts, including the solder balls that are used for this purpose. This underfill is used to distribute stress over larger areas from areas where this stress is typically concentrated. For instance, points of electrical contact are ideally located in one plane, as are the points of the matching and therewith aligned points of electrical contact. Where this planarity is not adhered to, the first matched points that make contact with each other bear an unusual large burden of the contacting forces, leading to extreme stress on these first contacting points of electrical contact.

Underfill can further beneficially be used to offset effects of thermal stress by for instance matching the Thermal Coefficient of Expansion (CTE) of the underfill with the CTE of the interfacing solder connections. Additional advantages that can be derived from the application of underfill are issues of chip protection from environmental influences such as moisture and from mechanical damage caused by for instance shock and vibration of the completed chip package.

The invention provides a method of mounting a flip chip over a supporting substrate whereby no underfill is applied, thereby eliminating a number of disadvantages, which will be highlighted at a later time, that are typically incurred by the application of flip chip underfill. The invention further provides for the creation of a flip chip packages whereby the need for solder flux application is removed.

U.S. Pat. No. 6,284,086 (Cardellino et al.) shows an underfill process for flip chips.

U.S. Pat. No. 6,168,972 (Wang et al.) reveals a flip chip pre-assembly underfill process.

U.S. Pat. No. 6,051,489 (Young et al.) discloses a flip chip pre-assembly underfill process.

U.S. Pat. No. 6,268,114 B1 (Wen et al.) shows a underfill of a solder window in a flip chip process.

SUMMARY OF THE INVENTION

A principle objective of the invention is to create a flip chip device package that can be assembled without the application of solder flux.

Another objective of the invention is to create a flip chip device package whereby the conventional method of providing an underfill for the package is replaced by a more effective method.

In accordance with the objectives of the invention a new method is provided to remove the conventional accumulation of a layer of tin oxide over the surface of solder bumps by means of fluorine based plasma treatment of the solder bumps. In addition, an improved method is provided for the application of underfill that replaces the conventional method of providing an underfill for a packaged flip chip device.

BRIEF DESCRIPTION OF THE DRAWINGS

FIGS. 1 through 5 show a prior art method of attaching a flip chip to a supporting substrate, as follows:

FIGS. 8 and 9 illustrate the first embodiment of the invention, as follows:

FIGS. 11 and 12 illustrate the second embodiment of the invention, as follows:

DESCRIPTION OF THE PREFERRED EMBODIMENTS

Figure 1:
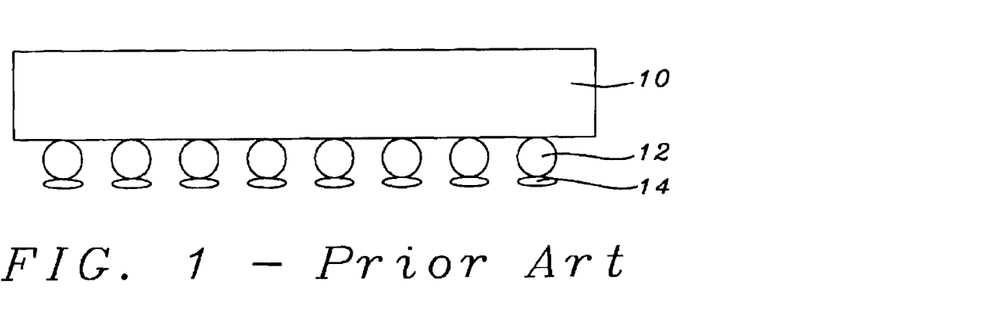
FIG. 1 shows a cross section of a semiconductor device, solder bumps have been provided over the active surface of the flip chip while solder flux has been applied to the solder bumps.

Referring first specifically to the FIGS. 1 through 5, and more specifically to the cross section that is shown in FIG. 1, therein is highlighted the cross section of a flip chip 10 that has been provided with solder bumps 12 over the active surface of the flip chip 10. Solder flux 14 has been provided to the solder bumps 12. One of the main reasons for the application of flux 14 is to "break" (or reduce) the high melting point of tin oxide that tends to form over the surface of the created solder bumps 12. Tin oxide is known to have a higher flow point than eutectic solder and is therefore an inhibitor to the reflow of the solder bump.

Figure 2:
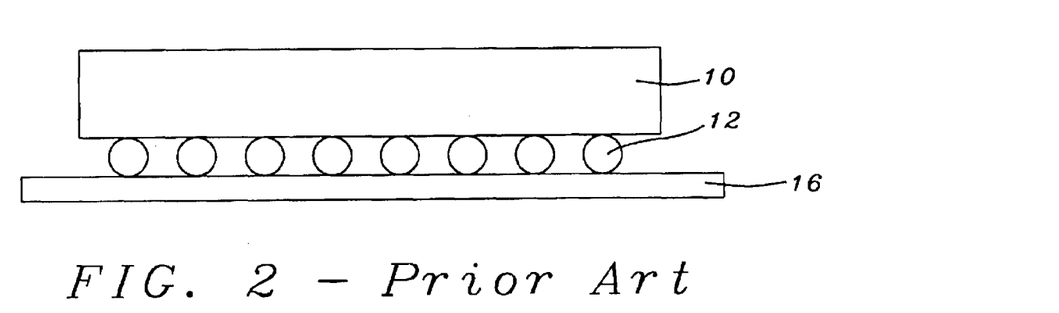
FIG. 2 shows a cross section after the flip chip has been attached to a supporting substrate.
Figure 3:
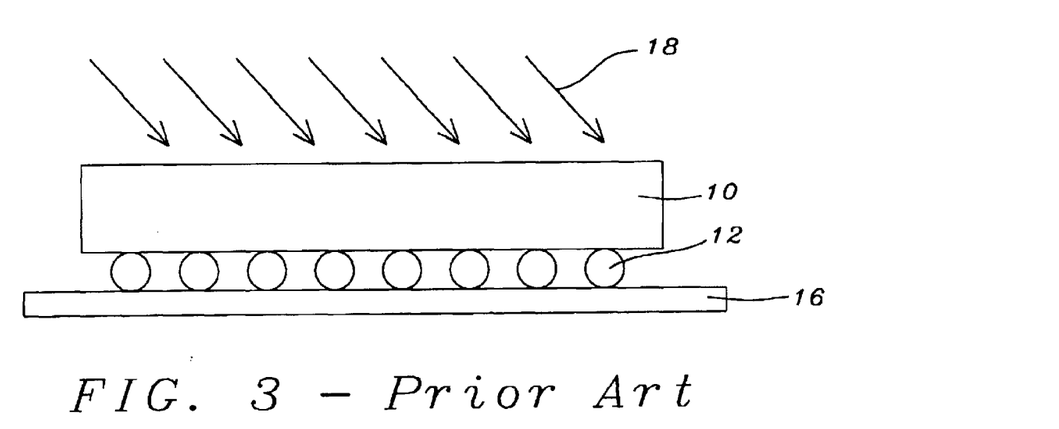
FIG. 3 shows a cross section during the step of solder reflow and flux clean.

The flip chip 10 is now ready for attachment to a supporting substrate 16, as shown in the cross section of FIG. 2. The solder bumps are for this purpose aligned with contact pads (not shown) in the surface of substrate 16 and lowered onto these contact pads. By now applying thermal energy 18, FIG. 3, to the aligned flip chip/substrate combination, reflow of the solder bumps 12 is accomplished whereby the solder bumps 12 form a continuous interface with the contact pads provided over the surface of substrate 16.

Figure 4:
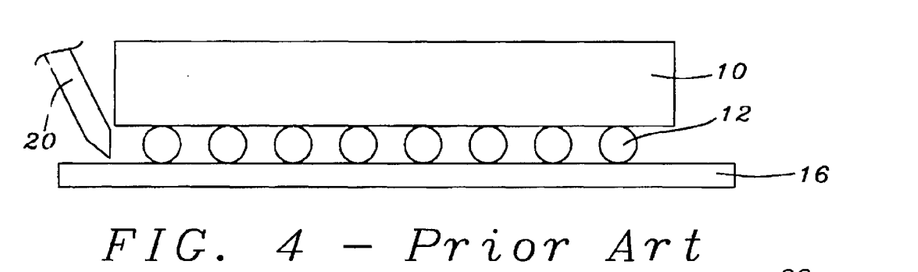
FIG. 4 shows a cross section during underfill dispensing and flow.

Underfill dispenser 20, FIG. 4, is then brought in a position from which underfill (not shown) can be inserted underneath the flip chip 10. The underfill is typically forced underneath the flip chip 10 over as wide a surface area as possible for optimization of the beneficial effects, such as CTE matching and reducing of mechanical stress in the solder bumps 12, of the provided underfill. It must thereby however be realized that narrow openings underneath the active surface of flip chip 10 are counterproductive in achieving this latter objective.

Figure 5:
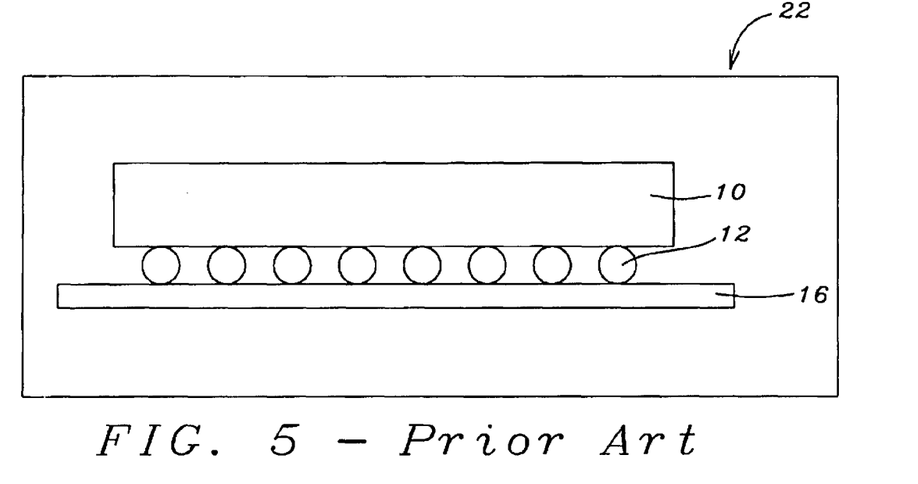
FIG. 5 shows a cross section during underfill cure.

A final step that is of significance to the invention is shown in the cross section of FIG. 5, where the structure that is shown in cross section in FIG. 4 is placed inside an oven 22 and heated for curing of the underfill.

From the above briefly highlighted overview of the conventional method of connecting a flip chip to a supporting substrate and of providing an underfill for the flip chip, the following disadvantages of this method can be summarized:

Flux residue causes corrosion of exposed metal surfaces of for instance the created metal interconnects, which leads to problems of package reliability Flux remnants are difficult to remove, especially where small gaps and small passageways are part of the created assembly The application of underfill imposes an underfill flow time as does the underfill cure process, both times being throughput detractors, and In cases where the underfill leaves voids surrounding for instance the created solder bumps, reliability of the completed package is negatively affected; voids lend themselves to the accumulation of undesired deposits in addition to being counter-productive with respect to the benefits that underfill is meant to provide to the completed package.

The conventional steps of attaching a flip chip and of providing underfill for the flip chip are highlighted in the flow chart of FIG. 6, a flow chart which follows the previously highlighted steps that have been explained using FIG. 1 through 5 and that is here provided for later comparisons with the method of the invention, thereby most significantly demonstrating the simplification of these processes of the invention.

Figure 6:
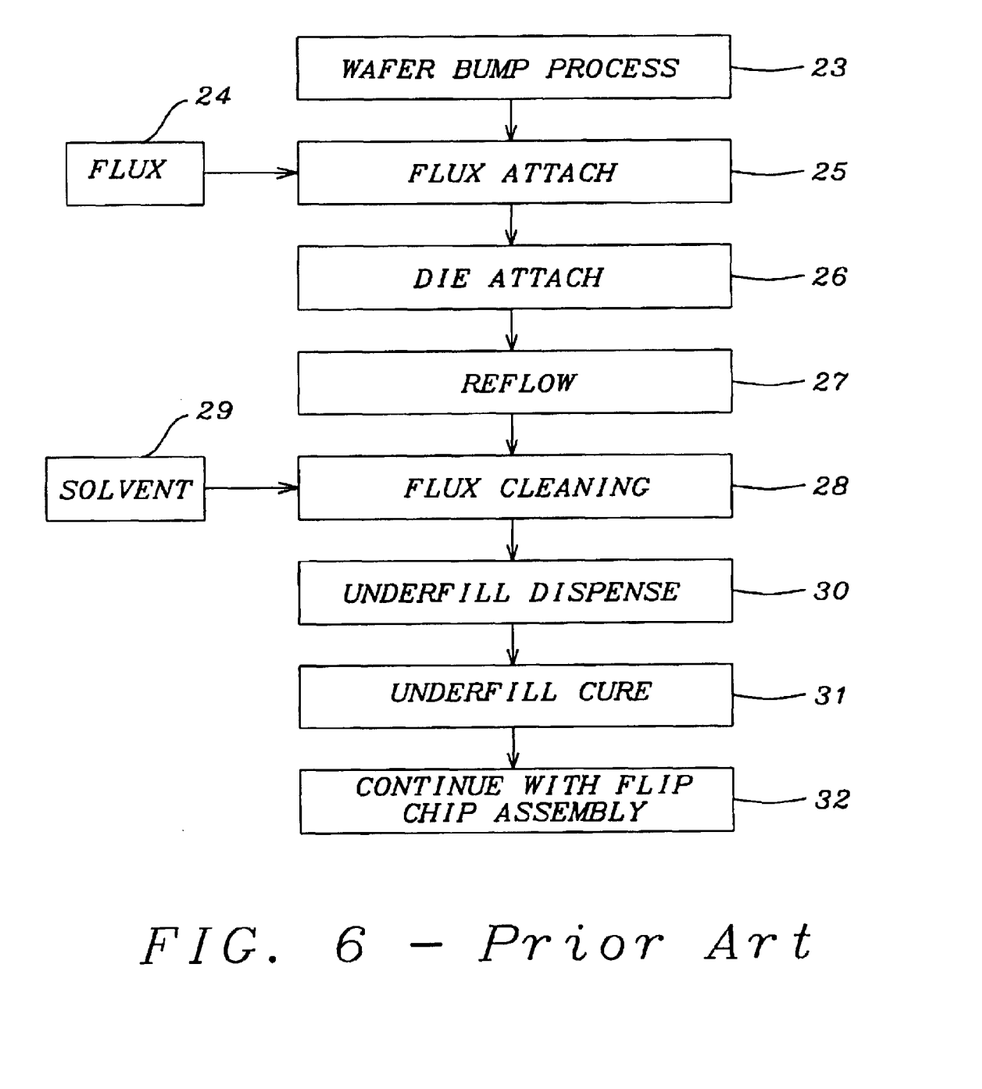
FIG. 6 shows a flow chart of the above highlighted prior art processing steps.

Referring to the flow chart of FIG. 6, there are highlighted the steps of:

23, the wafer bump process that provides solder bumps over active surface areas of the flip chip; this wafer bump process is not affected by the invention and will therefore not be further discussed 24, solder flux that is provided 25, the solder flux is attached to the solder bumps 26, the flip chip is positioned with respect to the supporting substrate and brought in an aligned manner in contact with contact pads provided over the surface of the substrate 27, solder reflow is performed 28, flux remnants are removed to the maximum extent possible 29, the solvent that is provided for the cleaning of flux remnants 30, the underfill is dispensed, forcing the underfill to penetrate underneath the flip chip to the maximum extent possible 31, the underfill is cured, and 32, the process of packaging the flip chip is continued, a processing sequence that is not germane to the invention and that therefore will not be further discussed.

Figure 7:
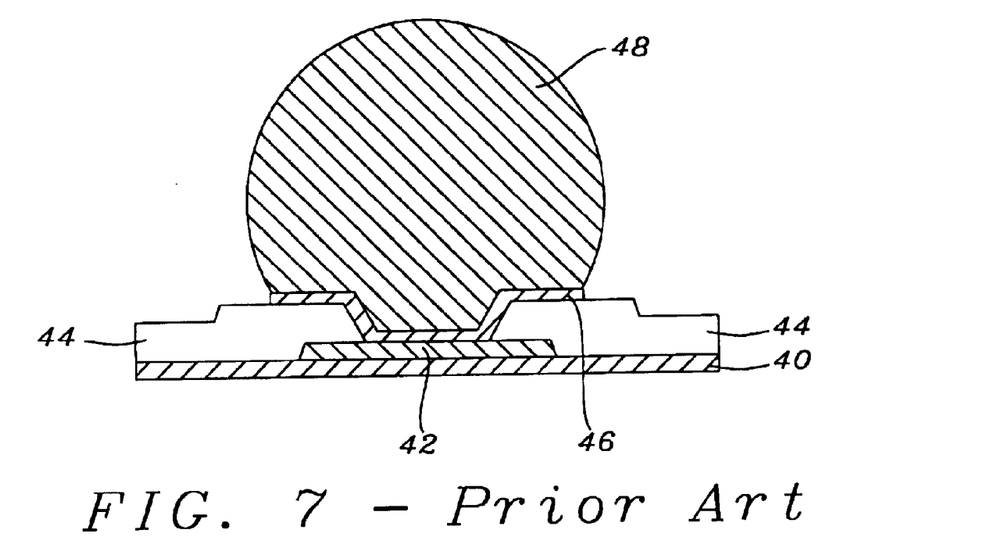
FIG. 7 shows a cross section of a prior art created solder bump.

Next, the process of creating a conventional solder bump will be briefly highlighted, using for this purpose the cross section of a solder bump that is shown in FIG. 7. Specifically highlighted in the cross section of FIG. 7 are:

40 is a semiconductor surface over which a solder bump is to be created 42 is a metal contact pad, typically containing aluminum, which is to be brought into contact with the solder bump and over which the solder bump therefore is to be created 44 is a patterned and etched layer of passivation 46 is a layer of Under Bump Metallurgy (UBM), and 48 is the created solder bump.

The prior art processing sequence for the formation of the solder bump that is shown in FIG. 7 is as follows:

applying a coating 44 of passivation material over the surface of the semiconductor surface 40 patterning and etching the layer 44 of passivation, creating an opening in the layer 44 of passivation that aligns with the aluminum pad 42 depositing a layer 46 of Under Bump Metallurgy (UBM) over the surface of the etched layer 44 of passivation material selectively depositing a layer 48 of Pb/Sn to form a solder bump selectively etching the deposited layer 46 of UBM using the deposited layer 48 of Pb/Sn as a mask, to electrically isolate the solder bump, and melting the selectively deposited layer 48 of Pb/Sn in a reflow furnace creating the spherically shaped solder bump 48.

Figure 8:
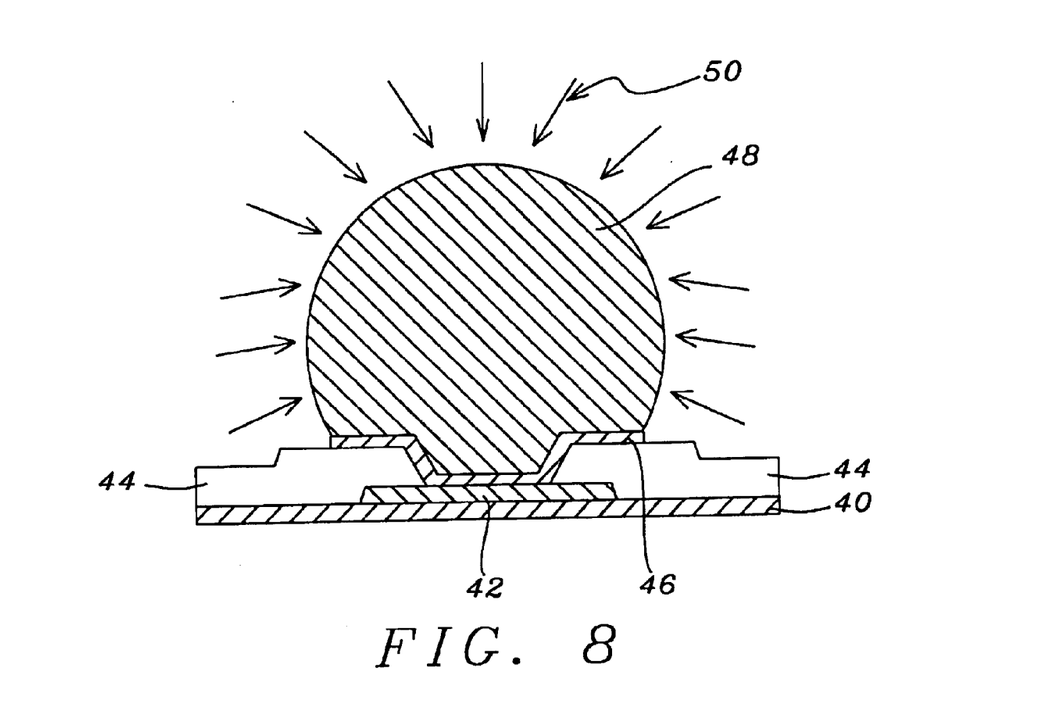
FIG. 8 shows the step of plasma treatment of the solder bump which has as objective to remove a layer of tin oxide from the surface of the solder bump.

For the first embodiment of the invention, the steps that lead to the creation of the solder bump that is shown in cross section in FIG. 7 are assumed and are not part of the invention, which leads to the cross section that is shown in FIG. 8.

In the cross section of FIG. 8, the completed solder bump 48 is, in accordance with the first embodiment of the invention, exposed to a $CF_4$ based plasma treatment 50. This $CF_4$ based plasma treatment 50 is of significant importance to the invention and substitutes the function that conventionally is provided by the application of solder flux, such as solder flux 14 in FIG. 1. As previously stated, the solder flux serves the function of reducing the high melting point of tin oxide that tends to form over the surface of a created solder bump. Since tin oxide is known to have a higher flow point than eutectic solder, the solder flux removes tin oxide as an inhibitor to the reflow of the solder bump.

The invention is based on the principle that a fluoride based plasma treatment, such as a $CF_4$ or $SF_4$ based plasma treatment, converts tin oxide to oxy-fluorides in accordance with the formula: $S_nO_x + (y) F \rightarrow S_nO_xF_y$.

As an example of a fluoride based plasma exposure to convert tin oxide into an oxy-fluoride can be cited applying isotropic plasma etching in an etchant comprising $SF_6$ or $CF_4$, performed in a parallel HDP reactor in-situ, at a flow rate of between about 30 and 60 sccm, in an organic carrier gas at a flow rate sufficient to maintain a pressure between about 5 and 15 mTorr in the HDP reactor and at an rf power of between about 400 and 1,200 Watts TCP and between about 1,000 and 1,500 Watts BIAS.

Figure 9:
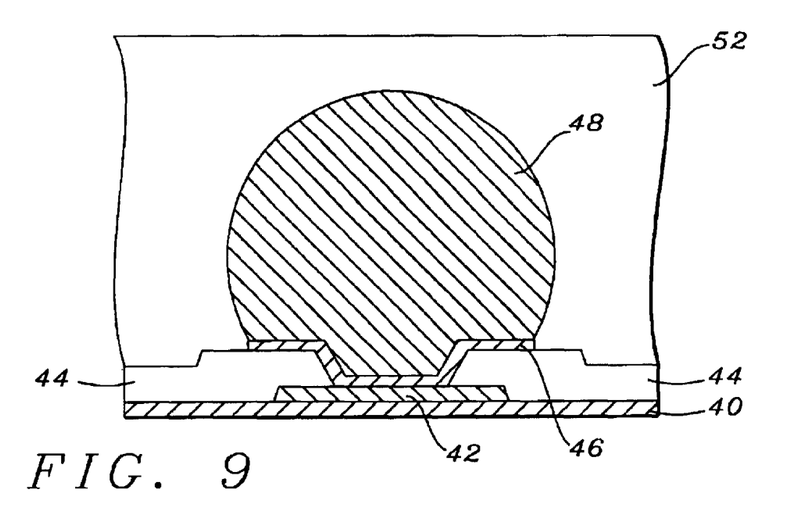
FIG. 9 shows a cross section after the coating of no-flow underfill.

By next, as not shown in the cross section of FIG. 9, providing no-flow underfill 52, which is known to disperse conformally, the flip chip (not shown), over the active surface of which the solder bump 48 has been created, is ready to be attached to a supporting substrate (not shown) after which reflow can be applied to the solder bump 48.

The processing steps for the first embodiment of the invention are as follows, as highlighted in the flowchart of FIG. 10:

53, the wafer bump process that provides solder bumps over active surface areas of the flip chip; this wafer bump process is not affected by the invention and will therefore not be further discussed 54, the exposed surface of the created solder bump is fluoride based plasma treated 55, a no-flow underfill coating is applied over the active surface of the flip chip 56, the flip chip is positioned with respect to the supporting substrate and brought in an aligned manner in contact with contact pads provided over the surface of the substrate 57, solder reflow is applied 58, the underfill is cured, and 59, the process of packaging the flip chip is continued, a processing sequence that is not germane to the invention and that therefore will not be further discussed.

Figure 10:
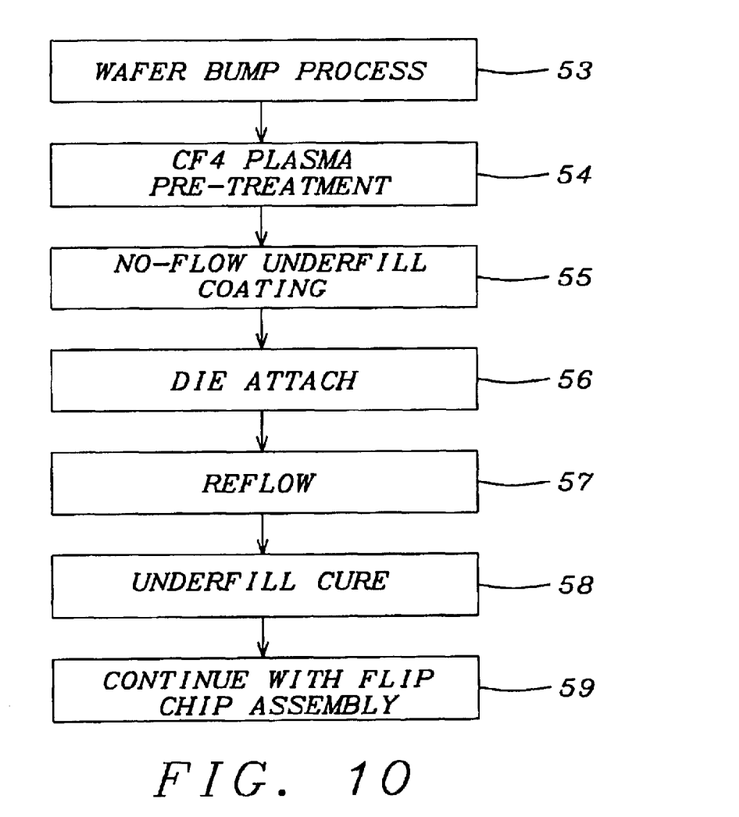
FIG. 10 shows flowchart of the processing steps of the first embodiment of the invention.

As most notable differences between the flow charts of FIGS. 6 and 10 can be observed:

no flux is required by the invention no flux dispensing tool is required by the invention no flux clean is required by the invention the invention provides a flux residue free environment and therefore does not have flux residue induced problems of reliability since the no-flow underfill requires only minimal flow time and requires no cure time, process throughput is increased by the invention, and the invention is suitable to small gap Integrated Circuits.

Under the second embodiment of the invention, problems of underfill that have been highlighted above can be avoided by applying the underfill over the surface of the substrate prior to die attach. This is further highlighted in the cross sections of FIGS. 11 and 12.

Figure 11:
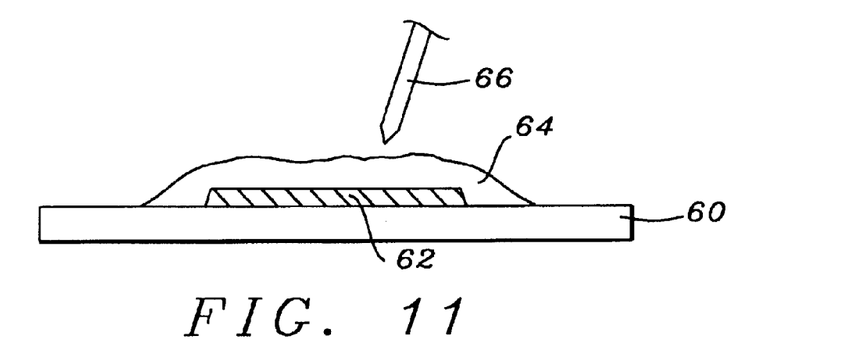
FIG. 11 shows a cross section of a contact pad created over the surface of a substrate during dispensing of a no-flow underfill over the surface of the contact pad.

Specifically shown in the cross section of FIG. 11 is a semiconductor surface 60, such as the surface of a device supporting substrate, over the surface of which a contact pad 62 has been provided. No-flow underfill 64 is dispensed over the surface of the contact pad 62 using dispenser 66 for this purpose.

Figure 12:
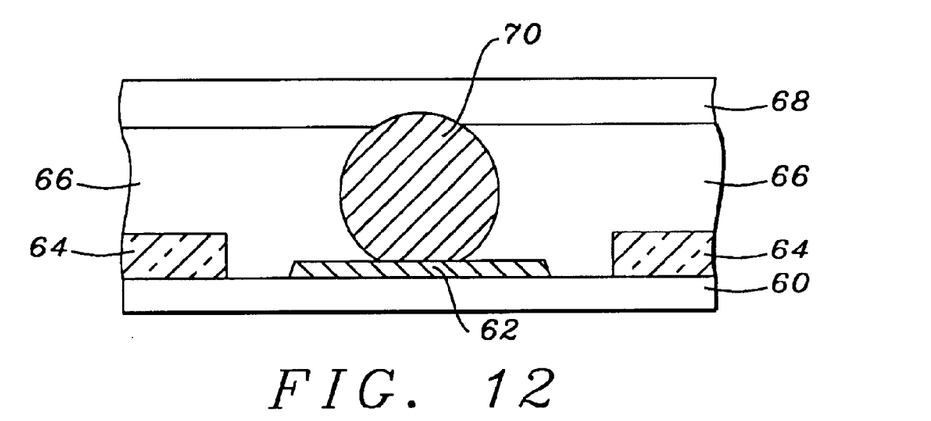
FIG. 12 shows a cross section after die attach and reflow of the underfill for the curing of the no-flow underfill.

A solder mask 64, FIG. 12, is created over the surface of substrate 60. By then attaching the flip chip 68, over the active surface of which solder bump 70 has been created, to the substrate 60 in alignment between the contact pad 62 and the solder bump 70, the advantages that are derived from applying no-flow underfill can be realized. After the die has been attached to the substrate, reflow of the solder bump is applied during which reflow the no-flow underfill is cured. This creates a package of which the cross section is shown in FIG. 12.

The invention can be summarized as follows:

1. a no-flux process is provided using a fluoride based plasma etch to break down the high temperature reflow nature of tin oxide 2. the conventional method of providing underfill is eliminated by:
   either coating a no-flow underfill over the surface of the chip after completion of the fluoride based plasma treatment of the solder bump provided over the active surface of the flip chip, or by
   coating no-flow underfill over the surface of the substrate prior to attaching the flip chip to the substrate 3. the conventional method of providing underfill can be eliminated in combination with the no-flux process and taking advantage of this process by:
   either coating a no-flow underfill over the surface of the chip after completion of the plasma treatment of the solder bump provided over the active surface of the flip chip, or by
   coating no-flow underfill over the surface of the substrate prior to attaching the flip chip to the substrate while as yet providing the plasma treatment of the solder bump provided over the active surface of the flip chip.

In short, the invention provides for:

1. a flux-less process 2. eliminating the conventional application of underfill, providing a first option of coating no-flow underfill over the surface of the flip chip and a second option of coating no-flow underfill over the surface of the substrate, and 3. combinations of the previous two approaches, that is combining the plasma treatment with the two options of providing underfill.

The following combinations are provided by the invention:

| | | | | | |
|---|---|---|---|---|---|
| Plasma Treatment | ✓ | | ✓ | ✓ | ✓ |
| No-flow Chip | | ✓ | ✓ | | ✓ |
| No-flow Substrate | | | ✓ | ✓ | ✓ | whereby the table entries represent:
1. fluoride based plasma treatment of the solder bumps
2. no-flow applied over the surface of the flip chip
3. no-flow applied over the surface of the substrate over which the flip chip is mounted, and
4. combinations of the above three cases as check-marked in the above table.

Although the invention has been described and illustrated with reference to specific illustrative embodiments thereof, it is not intended hat the invention be limited to those illustrative embodiments. Those skilled in the art will recognize that variation and modifications can be made without departing from the spirit of the invention. It is therefore intended to include within the invention all such variations and modifications which fall within the scope of the appended claims and equivalents hereof.

What is claimed is:

1. A flux-less method of creating a flip chip device package, comprising steps of:

providing a semiconductor device having been provided with at least one solder bump;

exposing said at least one solder bump of said semiconductor device to a fluoride based plasma, said fluoride based plasma comprising applying isotropic plasma etching in an etchant comprising $SF_6$ or $CF_4$, performed in a parallel HDP reactor in-situ, at a flow rate of between about 30 and 60 sccm, in an organ carrier gas at a flow rate sufficient to maintain a pressure between about 5 and 15 mTorr in the HDP reactor and at an rf power of between about 400 and 1,200 Watts TCP and between about 1,000 and 1,500 Watts BIAS;

providing a semiconductor device mounting support;

positioning said semiconductor device over the surface of said semiconductor device mounting support by aligning and establishing contact between said at least one solder bump and at least one contact pad provided over the surface of said semiconductor device mounting support; and joining said at least one solder bump to said contact pad by applying reflow to said at least one solder bump.

2. The method of claim 1, said semiconductor device comprising a flip chip device.

3. The method of claim 1, additionally applying a layer of no-flow underfill over the surface of said semiconductor device prior to said positioning said semiconductor device over the surface of said semiconductor device mounting support.

4. The method of claim 1, additionally applying a layer of no-flow underfill over the surface of said semiconductor device mounting support prior to said positioning said semiconductor device over the surface of said semiconductor device mounting support.

5. The method of claim 1, additionally comprising, prior to said positioning said semiconductor device over the surface of said semiconductor device mounting support, steps of:

applying a layer of no-flow underfill over the surface of said semiconductor device; and applying a layer of no-flow underfill over the surface of said semiconductor device mounting support.

6. A flux-less method of creating a flip chip device package, comprising steps of:

providing a semiconductor device having been provided with at least one solder bump;

exposing said at least one solder bump of said semiconductor device to a fluoride based plasma, said fluoride based plasma comprising applying isotropic plasma etching in an etchant comprising $SF_6$ or $CF_4$, performed in a parallel HDP reactor in-situ, at a flow rate of between about 30 and 60 sccm, in an organ carrier gas at a flow rate sufficient to maintain a pressure between about 5 and 15 mTorr in the HDP reactor and at an rf power of between about 400 and 1,200 Watts TCP and between about 1,000 and 1,500 Watts BIAS;

providing a semiconductor device mounting support;

applying a layer of no-flow underfill over the surface of said semiconductor device;

positioning said semiconductor device over the surface of said semiconductor device mounting support by aligning and establishing contact between said at least one solder bump and at least one contact pad provided over the surface of said semiconductor device mounting support; and joining said at least one solder bump to said contact pad by applying reflow to said at least one solder bump.

7. The method of claim 6, said semiconductor device comprising a flip chip device.

8. A flux-less method of creating a flip chip device package, comprising steps of:

providing a semiconductor device having been provided with at least one solder bump;

exposing said at least one solder bump of said semiconductor device to a fluoride based plasma, said fluoride based plasma comprising applying isotropic plasma etching in an etchant comprising $SF_6$ or $CF_4$, performed in a parallel HDP reactor in-situ, at a flow rate of between about 30 and 60 sccm, in an organ carrier gas at a flow rate sufficient to maintain a pressure between about 5 and 15 mTorr in the HDP reactor and at an rf power of between about 400 and 1,200 Watts TCP and between about 1,000 and 1,500 Watts BIAS;

providing a semiconductor device mounting support;

applying a layer of no-flow underfill over the surface of said semiconductor device mounting support;

positioning said semiconductor device over the surface of said semiconductor device mounting support by aligning and establishing contact between said at least one solder bump and at least one contact pad provided over the surface of said semiconductor device mounting support; and joining said at least one solder bump to said contact pad by applying reflow to said at least one solder bump.

9. The method of claim 8, said semiconductor device comprising a flip chip device.

10. A method of providing underfill in assembling a semiconductor device package, comprising steps of:

providing a semiconductor device having been provided with at least one solder bump, said at least one solder bump having been exposed to a fluoride based plasma, said fluoride based plasma comprising applying isotropic plasma etching in an etchant comprising $SF_6$ or $CF_4$, performed in a parallel HDP reactor in-situ, at a flow rate of between about 30 and 60 sccm, in an organ carrier gas at a flow rate sufficient to maintain a pressure between about 5 and 15 mTorr in the HDP reactor and at an rf power of between about 400 and 1,200 Watts TCP and between about 1,000 and 1,500 Watts BIAS;

providing a semiconductor device mounting support;

applying a layer of no-flow underfill over the surface of said semiconductor device;

positioning said semiconductor device over the surface of said semiconductor device mounting support by aligning and establishing contact between said at least one solder bump and at least one contact pad provided over the surface of said semiconductor device mounting support; and joining said at least one solder bump to said contact pad by applying reflow to said at least one solder bump.

11. The method of claim 10, said semiconductor device comprising a flip chip device.

12. A method of providing underfill in assembling a semiconductor device package, comprising steps of:

providing a semiconductor device having been provided with at least one solder bump, said at least one solder bump having been exposed to a fluoride based plasma, said fluoride based plasma comprising applying isotropic plasma etching in an etchant comprising $SF_6$ or $CF_4$, performed in a parallel HDP reactor in-situ, at a flow rate of between about 30 and 60 sccm, in an organ carrier gas at a flow rate sufficient to maintain a pressure between about 5 and 15 mTorr in the HDP reactor and at an rf power of between about 400 and 1,200 Watts TCP and between about 1,000 and 1,500 Watts BIAS;

applying a first layer of no-flow underfill over the surface of said semiconductor device;

providing a semiconductor device mounting support;

applying a second layer of no-flow underfill over the surface of said semiconductor device mounting support;

positioning said semiconductor device over the surface of said semiconductor device mounting support by aligning and establishing contact between said at least one solder bump and at least one contact pad provided over the surface of said semiconductor device mounting support; and joining said at least one solder bump to said contact pad by applying reflow to said at least one solder bump.

13. The method of claim 12, said semiconductor device comprising a flip chip device.

14. A flux-less method of creating a flip chip device package in combination with providing underfill in assembling a semiconductor device package, comprising steps of:

providing a semiconductor device having been provided with at least one solder bump;

exposing said at least one solder bump of said semiconductor device to a fluoride based plasma, said fluoride based plasma comprising applying isotropic plasma etching in an etchant comprising $SF_6$ or $CF_4$, performed in a parallel HDP reactor in-situ, at a flow rate of between about 30 and 60 sccm, in an organ carrier gas at a flow rate sufficient to maintain a pressure between about 5 and 15 mTorr in the HDP reactor and at an rf power of between about 400 and 1,200 Watts TCP and between about 1,000 and 1,500 Watts BIAS;

applying a first layer of no-flow underfill over the surface of said semiconductor device;

providing a semiconductor device mounting support;

applying a second layer of no-flow underfill over the surface of said semiconductor device mounting support;

positioning said semiconductor device over the surface of said semiconductor device mounting support by aligning and establishing contact between said at least one solder bump and at least one contact pad provided over the surface of said semiconductor device mounting support; and joining said at least one solder bump to said contact pad by applying reflow to said at least one solder bump.

15. The method of claim 14, said semiconductor device comprising a flip chip device.

16. A flux-less method of creating a flip chip device package, comprising steps of:

providing a semiconductor device having been provided with at least one solder bump;

exposing said at least one solder bump of said semiconductor device to a fluoride based plasma, said fluoride based plasma comprising applying isotropic plasma etching in an etchant comprising $SF_6$ or $CF_4$, performed in a parallel HDP reactor in-situ, at a flow rate of between about 30 and 60 sccm, in an organ carrier gas at a flow rate sufficient to maintain a pressure between about 5 and 15 mTorr in the HDP reactor and at an rf power of between about 400 and 1,200 Watts TCP and between about 1,000 and 1,500 Watts BIAS;

providing a semiconductor device mounting support;

applying a layer of underfill over the surface of said semiconductor device;

positioning said semiconductor device over the surface of said semiconductor device mounting support by aligning and establishing contact between said at least one solder bump and at least one contact pad provided over the surface of said semiconductor device mounting support; and joining said at least one solder bump to said contact pad by applying reflow to said at least one solder bump.

17. The method of claim 16, said underfill comprising a no-flow underfill.

18. The method of claim 16, said semiconductor device comprising a flip chip device.

19. A flux-less method of creating a flip chip device package, comprising steps of:

providing a semiconductor device having been provided with at least one solder bump;

exposing said at least one solder bump of said semiconductor device to a fluoride based plasma, said fluoride based plasma comprising applying isotropic plasma etching in an etchant comprising $SF_6$ or $CF_4$, performed in a parallel HDP reactor in-situ, at a flow rate of between about 30 and 60 sccm, in an organ carrier gas at a flow rate sufficient to maintain a pressure between about 5 and 15 mTorr in the HDP reactor and at an rf power of between about 400 and 1,200 Watts TCP and between about 1,000 and 1,500 Watts BIAS;

providing a semiconductor device mounting support;

applying a layer of underfill over the surface of said semiconductor device mounting support;

positioning said semiconductor device over the surface of said semiconductor device mounting support by aligning and establishing contact between said at least one solder bump and at least one contact pad provided over the surface of said semiconductor device mounting support; and joining said at least one solder bump to said contact pad by applying reflow to said at least one solder bump.

20. The method of claim 19, said underfill comprising a no-flow underfill.

21. The method of claim 19, said semiconductor device comprising a flip chip device.

22. A method of providing underfill in assembling a semiconductor device package, comprising steps of:

providing a semiconductor device having been provided with at least one solder bump, said at least one solder bump having been exposed to a fluoride based plasma, said fluoride based plasma comprising applying isotropic plasma etching in an etchant comprising $SF_6$ or $CF_4$, performed in a parallel HDP reactor in-situ, at a flow rate of between about 30 and 60 sccm, in an organ carrier gas at a flow rate sufficient to maintain a pressure between about 5 and 15 mTorr in the HDP reactor and at an rf power of between about 400 and 1,200 Watts TCP and between about 1,000 and 1,500 Watts BIAS;

applying a first layer of underfill over the surface of said semiconductor device;

providing a-semiconductor device mounting support;

applying a second layer of underfill over the surface of said semiconductor device mounting support;

positioning said semiconductor device over the surface of said semiconductor device mounting support by aligning and establishing contact between said at least one solder bump and at least one contact pad provided over the surface of said semiconductor device mounting support; and joining said at least one solder bump to said contact pad by applying reflow to said at least one solder bump.

23. The method of claim 22, said first underfill comprising no-flow underfill.

24. The method of claim 22, said second underfill comprising no-flow underfill.

25. The method of claim 22, said semiconductor device comprising a flip chip device.

26. A flux-less method of creating a flip chip device package in combination with providing underfill in assembling a semiconductor device package, comprising steps of:

providing a semiconductor device having been provided with at least one solder bump;

exposing said at least one solder bump of said semiconductor device to a fluoride based plasma, said fluoride based plasma comprising applying isotropic plasma etching in an etchant comprising $SF_6$ or $CF_4$, performed in a parallel HDP reactor in-situ, at a flow rate of between about 30 and 60 sccm, in an organ carrier gas at a flow rate sufficient to maintain a pressure between about 5 and 15 mTorr in the HDP reactor and at an rf power of between about 400 and 1,200 Watts TCP and between about 1,000 and 1,500 Watts BIAS;

applying a first layer of underfill over the surface of said semiconductor device;

providing a semiconductor device mounting support;

applying a second layer of underfill over the surface of said semiconductor device mounting support;

positioning said semiconductor device over the surface of said semiconductor device mounting support by aligning and establishing contact between said at least one solder bump and at least one contact pad provided over the surface of said semiconductor device mounting support; and joining said at least one solder bump to said contact pad by applying reflow to said at least one solder bump.

27. The method of claim 26, said first underfill comprising no-flow underfill.

28. The method of claim 26, said second underfill comprising no-flow underfill.

29. The method of claim 26, said semiconductor device comprising a flip chip device.

* * * * *